Figure 1:
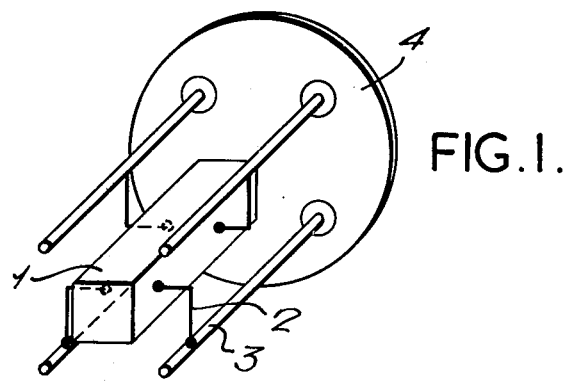

United States Patent [19]

Moreillon et al.

[11] 4,027,181

[45] May 31, 1977

[54] HOUSING AND SUPPORT FOR PIEZO-ELECTRIC RESONATOR

[75] Inventors: René Moreillon, Bienne; Claude Weber, Le Landeron, both of Switzerland

[73] Assignee: Societe Suisse pour l'Industrie Horlogere (SSIH) Management Services S.A., Bienne, Switzerland

[22] Filed: July 14, 1975

[21] Appl. No.: 595,501

[30] Foreign Application Priority Data

Aug. 20, 1974 Switzerland .................... 11321/74

[52] U.S. Cl. ............................................... 310/9.4
[51] Int. Cl.² ......................................... H01L 41/04
[58] Field of Search ............ 310/8.2, 9.1, 9.4, 8.9; 58/23 V, 23 AO; 174/52 FP

[56] References Cited

UNITED STATES PATENTS

| | | |
|---|---|---|
| 3,046,423 | 7/1962 | Wolfskill ............................ 310/9.1 |
| 3,221,189 | 11/1965 | Brandt et al. ..................... 310/9.4 X |
| 3,335,336 | 8/1967 | Urushida et al. ............... 174/52 FP |
| 3,480,836 | 11/1969 | Aronstein ....................... 174/52 FP |
| 3,535,486 | 10/1970 | Wood .............................. 174/52 FP |
| 3,832,761 | 9/1974 | Sheahan et al. ................ 310/9.4 X |
| 3,906,249 | 9/1975 | Gibert et al. ........................ 310/9.1 |
| 3,913,195 | 10/1975 | Beaver .............................. 310/9.4 X |

Primary Examiner—Mark O. Budd
Attorney, Agent, or Firm—Griffin, Branigan and Butler

[57] ABSTRACT

A piezo-electric resonator comprises a rectangular piezo-electric bar mounted interiorly of a frame formed of a multi-layered insulating material. The frame is impermeably enclosed by two cover members. The frame comprises a fastening arrangement including a suspension formed of thin conductors attached to the bar and arranged along one or more lines in the plane of one face of the bar. The thin suspension conductors are fixed to the face of the bar along nodal lines and are elbowed at least once on each side of the bar. The layered frame has a special construction.

7 Claims, 7 Drawing Figures

HOUSING AND SUPPORT FOR PIEZO-ELECTRIC RESONATOR

This invention concerns a piezo-electric resonator in which this oscillating element comprises a parallelepipedon of quartz or other suitable material including certain ceramics.

The suspension of a piezo-electric bar is frequently obtained by means of more or less flexible conductors fastened on one hand to the bar by soldering or brazing and connected in a suitable manner to the exciting electrodes, and on the other hand to conductive members integral with or fixed to a housing or support, insulated and electrically connected. The position at which the conductors are fastened to the bar is chosen so as to minimise the effect of the suspension on the resonator performance brought about by mechanical coupling. Generally such positions correspond to zones of minimal vibration (nodal zones).

Thus for bars vibrating according to the longitudinal or bending modes, the known types of suspension include conductive wires arranged to be fixed in point contact within the nodal arranged to be fixed in point contact within the nodal zones of two surfaces of the bar. Such an arrangement however causes problems in the precise determination of the contact points in respect of the bar geometry. Thus, where it is desired to provide automatic assembly of the bar with its suspension wires and thereafter within the housing or support the operations become exceedingly delicate both in positioning the components and maintaining them in position during the soldering or brazing step.

The invention thus seeks to avoid the type of difficulty inherent to such known suspensions and thus to reduce production costs.

Basically the construction "in space" is replaced by a flat assembly of the complete resonator.

Accordingly the invention comprises a piezo-electric resonator in the form of a rectangular bar wherein the bar is placed in the interior of a frame formed of a multi-layered insulating material and is impermeably enclosed by two cover members, a fastening arrangement within the frame including a suspension formed of thin conductors arranged along one or more lines in the plane of one face of the bar.

Preferably the conductors are entirely arranged in this plane up to a line of fastening to the frame. The frame is arranged with an interior metallized strip adapted to fasten to the conductors and electrically coupled to exterior conducting surface whereby the resonator may be incorporated into a circuit.

For a better understanding of the invention reference will now be made to the following detailed description in conjunction with the accompanying drawings in which:

FIG. 1 is a perspective view of the assembly of a piezo-electric resonator bar in accordance with the prior art.

Figure 2:
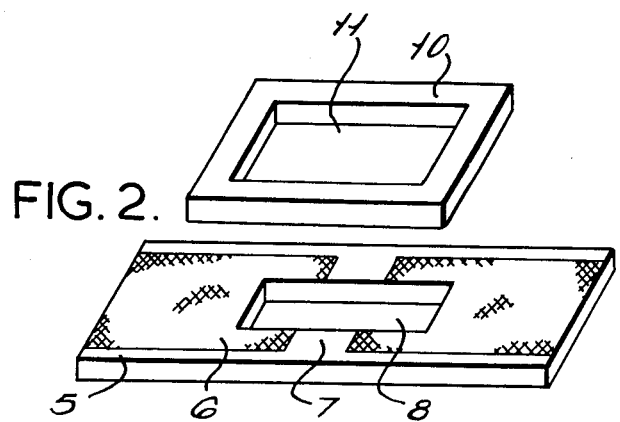
Figure 3:
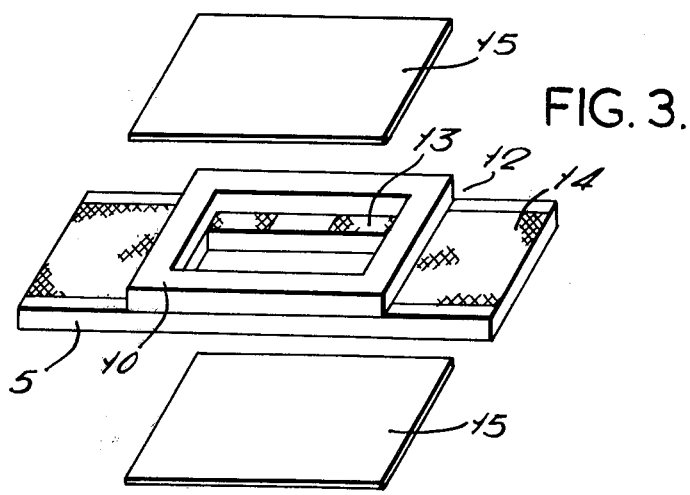
Figure 4:
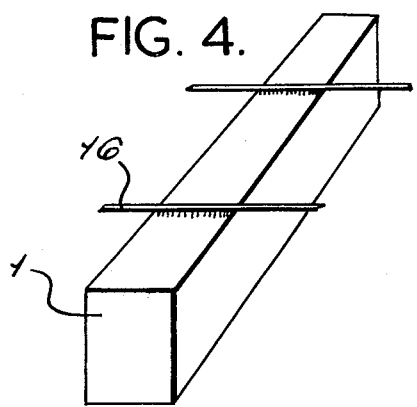
Figure 5:
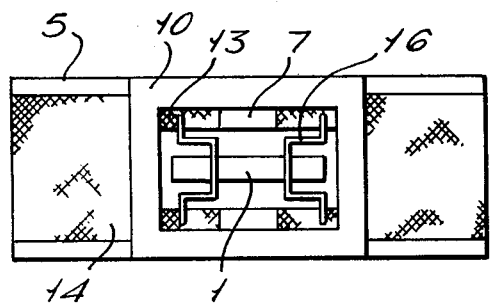
Figure 6:
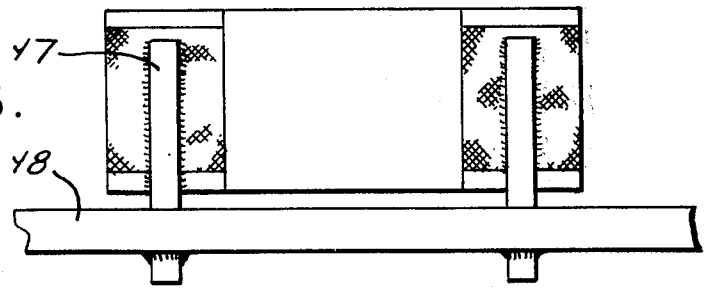
Figure 7:
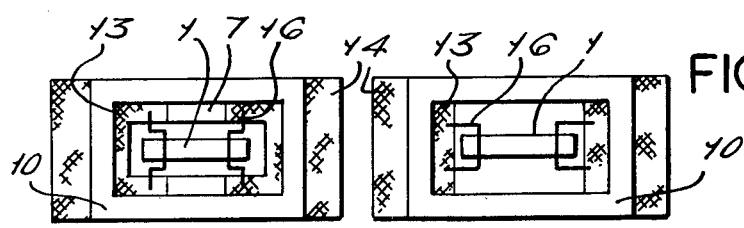

FIG. 2 is an exploded perspective view of the frame components for a resonator according to the invention, FIG. 3 is similar to FIG. 2 but shows an assembled frame and the separated cover members, FIG. 4 is a persective view of the fixing of the suspending conductors to the piezo-electric bar, FIG. 5 is a plan view of an assembled resonator according to the invention, with cover removed, FIG. 6 shows the resonator closed and soldered to a printed circuit, and FIG. 7 shows two variants of the assembly of FIG. 5.

The resonator shown in FIG. 1 and which illustrates the prior art comprises a bar in the form of a parallelepipedon 1 suspended by four elbowed conductors 2 from four parallel arms 3. Arms 3 surround bar 1 and are fastened to a base 4, the entire assembly being electrically connected and enclosed in a housing in a suitable manner. The fixation points of conductors 2 to bar 1 are located within the nodal zones of two opposed faces of the bar. The exciting electrodes (not shown) on bar 1 are connected to conductors 2 in any suitable manner. It is clear that such three dimensional structural arrangements will cause numerous problems for the precise positioning of the elements relative to one another and thus will result in relatively high costs.

A resonator according to the invention includes a frame which can be fabricated by the well-known multi-layer technique and is closed in a manner to form an encapsulation within which is suspended the piezo-electric bar. The elements of such an encapsulation may for example be as shown in the exploded views of FIGS. 2 and 3, such specific arrangements being intended as illustrative only and not intended to limit the possibilities. Herein an insulating rectangular plaque 5 formed for example from a ceramic material is provided on one of its faces with a surface metallization 6 limited to two separate areas divided from one another by a path 7 extending along the transversal axis of plaque 5, there being no metallization on path 7. In the centre of plaque 5 is provided an opening 8 also of rectangular form of which the two opposite ends in the longitudinal sense are each situated within a metallized zone 6 or at least contiguous to such metallized zones in a manner such that the opening 8 extends at least over its entire width on the insulating path 7.

A second rectangular plaque 10 also formed of insulating material and obtained by means of the same technique as plaque 5 is provided with a rectangular opening 11, at least one of the dimensions of which is greater than the corresponding dimension of opening 8. The second plaque 10 is impermeably fixed according to a well-known process to the first plaque 5 with the two openings 8 and 11 being centered relative to one another. The tight assembly of the two plaques 5 and 10 results in a frame designated as 12 in the example as shown in FIG. 3 and which is provided with an interior pathway provided with at least two conductive zones 13. These zones 13 are electrically coupled to open exterior contact surfaces 14 by virtue of the fact that zones 13 and surfaces 14 are both obtained from the original metallized areas 6 of plaque 5.

The two exterior faces of frame 12 each receive following assembly of the bar 1, as described hereinafter, a cover member 15. Te impermeable fastening of covers 15 may be obtained by glueing or if the cover members 15 should be metallic by pressure welding, brazing or soldering onto corresponding surfaces of frame 1 which may be metallized to enable such operation.

Bar 1 is provided with wires or thin conductive ribbons 16 which are fastened thereto as shown in FIG. 4 along one or more lines located in the plane of one of its surfaces. Such lines are chosen to be within the nodal region or region of minimum amplitude. The excitation electrodes which are not shown are arranged on the surface of the bar and are connected in an appropriate manner to conductors 16. Conductors 16 are preferably elbowed to provide elasticity in the mounting and to avoid harmful mechanical coupling effects. Such conductors on either end of the bar are fixed to the metallized interior pathways 13 of frame 12, preferably in a manner such that the surface of bar 1 under consideration and the pathways are in parallel planes or better still in the same plane, such plane containing entirely conductors 16.

Such an arrangement as shown in FIG. 5 permits easy machining of the suspensions in large numbers in the form of chemically engraved bands. The bars may be fastened directly to such bands, the bands themselves being for example provided with holes or index points necessary for the longitudinal positioning of the bars by means of pins. Such type of flat assembly makes the cross positioning of the bars non-critical for resonator performances. The hole or index points on the bands may thereafter serve for separation by cut off as well as the placing within frame 12 of the assembly comprising the bar and its conductors. The fixing of the conductor 16 to bar 1 and to the conductive zones 13 may be obtained by any appropriate process notably through glueing, brazing, soldering, compression welding, electrolytic process or others.

The overhanging portion of the first plaque 5 to form frame 12 results in a resonator complete with fixing lugs which, provided with the conductive layer 14 remaining from the original metallization 6, serve at the same time as electrical coupling points. Preferably, conductors 17 may be fixed thereto to facilitate the subsequent assembly of the resonator to a printed circuit 18 as shown for example by FIG. 6. Additionally the assembled resonator may be potted in an epoxy resin thereby improving both its electrical and mechanical insulation.

Variations in the relative dimensions of openings 18 and 11 of the two plaques 5 and 10 which form frame 12 may be adopted within the frame-work of the invention. Thus, FIG. 7 in a manner similar to FIG. 5 shows two possibilities where only two conductive zones 13 remain on the interior pathway. Possible arrangements of bar 1 and conductors 16 are likewise shown.

What we claim is:

1. A piezo-electric resonator assembly comprising a rectangular piezo-electric bar and a frame, said bar being mounted within a cavity of said frame, said frame being formed of a multi-layered insulating material and including two cover members for enclosing said bar in said frame and a metallized conductive layer extending from the exterior of said frame to the interior thereof, said resonator assembly further comprising a suspension means for suspending said bar within said cavity and for providing the electrical conductivity between said metallized conductive layer and said bar, said suspension means including at least two thin conductors both extending laterally across and confined in the plane of a single face of said bar and being attached to said bar continuously along lateral lines formed by contact between the thin conductors and the bar, said plurality of thin conductors each including suspension portions extending laterally outwardly on opposite sides of said bar with each of said opposite suspension portions being attached to said metallized conductive layers.

2. A piezo-electric reonator as defined in claim 1 wherein said at least two thin conductors each traverse and are fixed to the face of the bar along a nodal line and are elbowed at least once on each side of the bar, the conductors having free extremities which are attached to metallized areas of the frame.

3. A piezo-electric resonator as defined in claim 1 wherein said frame further comprises a first layer provided with an elongated opening, one face of the layer being provided with a surface metallization in the form of two regions located on each side of the transversal centre line of the opening, said regions being separated by an area where the layer is unmetallized, said opening extending longitudinally at least to the edge of the unmetallized area.

4. A piezo-electric resonator as defined in claim 3 wherein said frame comprises a second layer provided with an opening at least one dimension of which is greater than a corresponding dimension of said opening in the first layer, the second layer being fastened to the metallized surface of the first layer in a manner such that the openings in said layers are at least approximately centered relative to one another.

5. A piezo-electric resonator as defined in claim 4 wherein the two layers forming the frame are respectively dimensioned such that a portion of each metallized region of the first layer on either side of the area contacted by the second layer remains uncovered.

6. A piezo-electric resonator as defined in claim 5 wherein a conductive wire is fixed to each of the uncovered metallized regions to enable permanent connection of the resonator to a printed circuit.

7. A piezo-electric resonator as defined in claim 1 wherein the impermeably enclosed frame is potted in an epoxy resin.

* * * * *